United States Patent
Bryla et al.

(10) Patent No.: US 10,693,310 B2
(45) Date of Patent: Jun. 23, 2020

(54) HICCUP CHARGER

(71) Applicant: Sargent Manufacturing Company, New Haven, CT (US)

(72) Inventors: Mark Bryla, Cumming, GA (US); Michael Lorello, Guilford, CT (US)

(73) Assignee: Sargent Manufacturing Company, New Haven, CT (US)

( * ) Notice: Subject to any disclaimer, the term of this patent is extended or adjusted under 35 U.S.C. 154(b) by 90 days.

(21) Appl. No.: 16/142,658

(22) Filed: Sep. 26, 2018

(65) Prior Publication Data

US 2019/0131818 A1    May 2, 2019

Related U.S. Application Data

(60) Provisional application No. 62/579,249, filed on Oct. 31, 2017.

(51) Int. Cl.

| H02J 7/34 | (2006.01) |
|---|---|
| E05B 47/00 | (2006.01) |
| G05F 1/46 | (2006.01) |
| G01R 19/165 | (2006.01) |
| H02J 9/06 | (2006.01) |

(52) U.S. Cl.
CPC .......... *H02J 7/345* (2013.01); *E05B 47/0001* (2013.01); *G01R 19/16528* (2013.01); *G05F 1/46* (2013.01); *E05B 2047/0058* (2013.01); *H02J 9/06* (2013.01); *H02J 9/068* (2020.01)

(58) Field of Classification Search
CPC ....................................................... H02J 7/345
See application file for complete search history.

(56) References Cited

U.S. PATENT DOCUMENTS

| 2013/0255335 A1* | 10/2013 | Jonely | E05B 47/0012 70/277 |
| 2015/0115622 A1* | 4/2015 | Burdenko | E05B 47/0001 292/138 |
| 2018/0340351 A1* | 11/2018 | Harkonen | G07C 9/00944 |

* cited by examiner

*Primary Examiner* — Daniel J Cavallari
(74) *Attorney, Agent, or Firm* — Wolf, Greenfield & Sacks, P.C.

(57) ABSTRACT

Various door locks and their methods of operation are described. In one embodiment, one or more capacitors are discharged to power one or more electrical loads of a door lock and then charged by one or more associated power sources. During this type of operation, a voltage of the one or more capacitors may cyclically vary between a first voltage threshold and a second voltage threshold. Methods related to estimating an amount of energy provided to the one or more capacitors using time measurements are also described.

12 Claims, 6 Drawing Sheets

HICCUP CHARGER

RELATED APPLICATIONS

This Application claims the benefit under 35 USC 119(e) of U.S. Application Ser. No. 62/579,249, filed Oct. 31, 2017, titled "DOOR LOCK ELECTRICAL SYSTEM AND METHOD OF OPERATION", which is hereby incorporated by reference in its entirety.

FIELD

Disclosed embodiments are related to door lock electrical systems and their method of operation.

BACKGROUND

Electrical door locks are used in a number of different applications and may be powered using any number of different types of power sources. Types of power sources that may be used include, for example, hard wired power, harvested energy, secondary electrochemical cells, and primary electrochemical cells. Depending on the type of power source used different types of maintenance and/or assembly issues may be encountered. For example, hardwired power may fail during a power outage; primary and secondary electrochemical cells may need to be periodically replaced; and devices used to harvest different forms of energy may fail.

SUMMARY

In one embodiment, an electrical door lock includes at least one power source, at least one voltage regulator in electrical communication with the at least one power source, one or more capacitors in electrical communication with the at least one voltage regulator, and one or more electrical loads of the electrical door lock in electrical communication with the one or more capacitors. When a voltage of the one or more capacitors is less than a first voltage threshold, the at least one voltage regulator supplies power from the at least one power source to the one or more capacitors. Further, when the voltage of the one or more capacitors is greater than a second voltage threshold that is greater than the first voltage threshold, the at least one voltage regulator stops the supply of power from the at least one power source to the one or more capacitors.

In another embodiment, a method of operating a door lock electrical system includes: supplying power from at least one power source to at least one voltage regulator; supplying power from the at least one voltage regular to one or more capacitors when a voltage of the one or more capacitors is less than a first voltage threshold; disabling the at least one voltage regulator to stop the flow of power to the one or more capacitors when the voltage of the one or more capacitors is greater than a second voltage threshold that is greater than the first voltage threshold; and supplying power from the one or more capacitors to one or more electrical loads of the electrical door lock.

In yet another embodiment, a method includes: supplying power from at least one power source to one or more capacitors; measuring a time to charge the one or more capacitors from a first voltage threshold to a second voltage threshold that is larger than the first voltage threshold; determining an amount of energy supplied to the one or more capacitors from the at least one power source based on the measured time; and updating at least one energy registry with the amount of energy supplied to the one or more capacitors.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1:
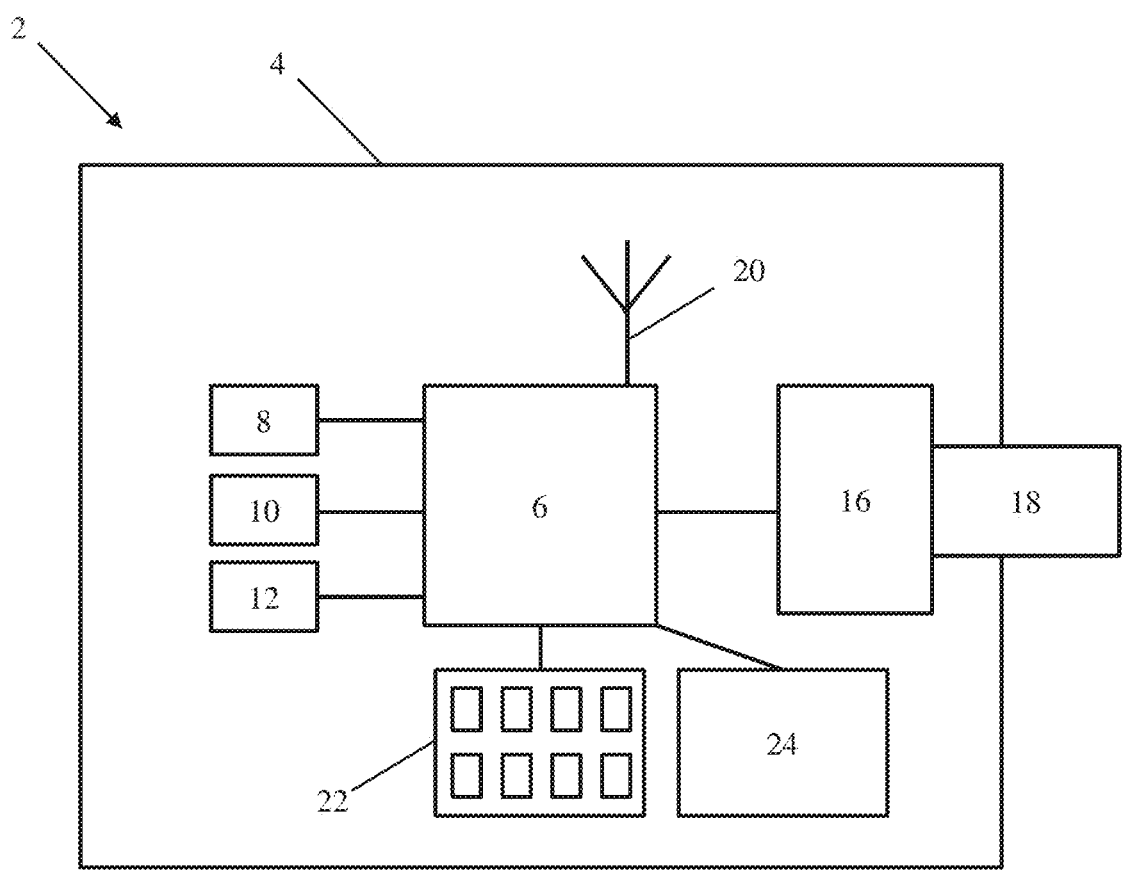
FIG. 1 is a schematic representation of an electrical door lock.

The Inventors have recognized that it may be desirable to reduce the energy consumption of the electrical system of a door lock. In some applications, this may result in reduced maintenance for the door lock due to the lowered power requirements resulting in extended battery lives. Thus, the associated primary and/or secondary electrochemical cells may be changed less often which reduces the associated maintenance costs. Alternatively, the reduced energy consumption may permit the usage of smaller electrochemical cells while still providing the same expected usage life and/or maintenance schedule.

In view of the above, the Inventors have recognized the benefits associated with using one or more capacitors to buffer power delivered to one or more electrical loads from one or more associated power sources. For example, in one embodiment, an electrical door lock may include at least one power source and one or more capacitors that are in electrical communication with the power source. The one or more capacitors may be charged by the one or more power sources and may deliver that power to the one or more electrical loads. This power may be provided on a periodic or continuous basis as the disclosure is not so limited. In some embodiments, the at least one power source may supply power to the one or more capacitors when a voltage of the capacitors drops below a first voltage threshold. This power may continue to be supplied to the one or more capacitors until a voltage of the one or more capacitors rises above a second voltage threshold that is greater than the first voltage threshold. At this point, the power supplied from the at least one power source to the one or more capacitors may be stopped. This process may be repeated cyclically as the one or more capacitors are repeatedly discharged from power leakage and/or powering the one or more electrical loads.

In some embodiments, the above-noted power provided to the one or more capacitors may be controlled using at least one voltage regulator. For example, in one embodiment, a voltage regulator may be in electrical communication with the at least one power source and the one or more capacitors. Accordingly, when the voltage of the one more capacitors is lower than the first voltage threshold, the voltage regulator may be enabled to supply power from the at least one power source to the one or more capacitors. Once the voltage of the one or more capacitors is greater than the second voltage threshold, the voltage regulator may be disabled stopping the supply of power from the at least one power source to the one or more capacitors. However, embodiments in which power is supplied to the one or more capacitors without the use of a voltage regulator are also contemplated as the disclosure is not so limited.

Depending on the embodiment, it may be desirable to provide a smaller power source for a door lock. However, this may limit the maximum power that may be supplied by the power source to one or more electrical loads of an electrical door lock. Accordingly, in some embodiments in which one or more capacitors are charged by a power source of the door lock, the one or more capacitors may have a maximum power rating that is greater than a maximum power rating of the associated power source, or power sources, used to power the one or more capacitors. Accordingly, a maximum magnitude of the power supplied to the one or more electrical loads by the one or more capacitors may be greater than a maximum magnitude of the power supplied to one or more capacitors by the power source or power sources.

In addition to the above, the Inventors have recognized the benefits associated with reducing the power used to count the energy generated and/or consumed by a door lock. As described in more detail below, the energy generated or consumed by a door lock may be determined based at least partly on a measurement of the time it takes for the one or more capacitors to be charged from a first voltage threshold to a second voltage threshold greater than the first voltage threshold. After determining the amount of energy that has either been generated and/or consumed, one or more energy registries contained within a memory associated with a controller of the electrical door lock may be updated to indicate an amount of energy that has been generated and/or consumed by the door lock during operation.

It should be understood that any appropriate type of memory may be used to store the one or more energy registries of a door lock used to track the generated and/or consumed energy. For example, appropriate types of memory include, but are not limited to, an EEPROM, NAND flash memory, NOR flash memory, battery-powered static RAM, and/or any other appropriate type of memory as the disclosure is not so limited.

It should be understood that an electrical door lock that includes one or more capacitors used to buffer a voltage from one or more power sources may include any number of capacitors in any number of different configurations. For example, in some applications, a single capacitor may be used. Alternatively, if it is desirable to increase a capacity and/or total voltage of the one or more capacitors, a plurality of capacitors may be used either in series and/or in parallel with one another. For example, two or more capacitors arranged in series would increase a voltage output of the capacitors. Correspondingly, placing two or more blocks of capacitors in parallel with each other, where each block includes one or more capacitors, would increase a capacity of the plurality of capacitors without raising a corresponding voltage of the individual blocks. Accordingly, it should be understood that the currently disclosed systems are not limited in the number and/or arrangement of the one or more capacitors described herein as the disclosure is not so limited.

In embodiments using a plurality of capacitors, it may be desirable to include one or more balancing circuits to balance the voltages and/or state of charge of the plurality of capacitors between each other. Various types of balancing circuits may be used with the currently disclosed embodiments as the current disclosure is not limited to any particular balancing circuit. For example, block balancing between capacitors located in parallel with one another may be used in some embodiments. Additionally, in some embodiments balancing of voltage and/or charge of capacitors located in series may be implemented. The balancing circuits may either be passive circuits that simply discharge the capacitors based on voltage imbalances, and/or the balancing circuit may implement active balancing. Accordingly, it should be understood that the current disclosure is not limited to any particular method or system for balancing the voltage and/or states of charge of the different capacitors.

Super capacitors offer a desirable combination of increased power storage while retaining the ability to provide relatively large charge and discharge rates. Additionally, many super capacitors may also exhibit extremely low self-discharge rates and lower in-line resistances as compared to other more typical systems used typical electrical systems for door locks, including, for example, trickle chargers. Thus, super capacitors may provide benefits such as increased maximum power draws, reduced power leakage, and/or reduced energy consumption for a system. Accordingly, in some embodiments, the one or more capacitors used in the various embodiments described herein may correspond to one or more super capacitors. Appropriate types of super capacitors include, but are not limited to, electrostatic double-layer capacitors, electrochemical pseudo-capacitors, hybrid capacitors such as lithium ion capacitors, and/or any other appropriate type of super capacitor as the disclosure is not so limited.

It should be understood that a super capacitor used in any of the embodiments described herein may have any appropriate combination of operating parameters. However, in one embodiment, a super capacitor may have a leakage rate during a quiescent charge state (i.e. when not actively been charged or discharged) between or equal to 1 $\mu A/hr$ and 10 $\mu A/hr$, 2 $\mu A/hr$ and 5 $\mu A/hr$, 2 $\mu A/hr$ and 3 $\mu A/hr$, or any other appropriate leakage rate at the nominal operating voltage. In certain embodiments, the super capacitor may also provide currents between or equal to 0.5 A and 2 A, 0.75 A and 1.5 A, 0.8 A and 1.2 A, or any other appropriate current range at a nominal voltage between or equal to 4.5 V and 6.0 V, 4.8 V and 5.5 V, 5.0 V and 5.4 V, or any other appropriate voltage range. A device including one or more super capacitors may provide the desired current and voltage for any desired duration. However, in some embodiments, one or more super capacitors may be configured to provide the desired current and voltage to one or more electrical loads for pulse durations less than or equal to 300 ms, 200 ms, 150 ms, 100 ms, or any other appropriate time.

In some embodiments, it may be desirable to provide a minimum current and/or power from one or more capacitors to the one or more associated electrical loads regardless of duration. In such an embodiment, the one or more capacitors and associated one or more power sources may be configured to provide a desired constant minimum current without a duration limit. For example, a current and/or power provided to charge the one or more capacitors from an associated power source may be equal to the desired minimum current and/or power. Thus, the one or more capacitors may provide an initial larger current and/or power that decreases to the minimum current and/or power at longer pulse duration times and/or during continuous operation. In some embodiments, a minimum current provided to the one or more electrical loads by the power source and one or more capacitors may be between or equal to 50 mA and 300 mA, 100 mA and 200 mA, 75 mA and 125 mA, 125 mA and 175 mA, or any other appropriate current.

It should be understood that while specific combinations of currents, voltages, and pulse durations have been detailed above with regards to specific embodiments, capacitors having any appropriate combination of these operating parameters and/or operating parameters that are different than those described above are also contemplated as the disclosure is not so limited.

During operation, the one or more capacitors described in the various embodiments herein may be operated between a first voltage threshold and a second voltage threshold that is greater than the first voltage threshold. For example, charging of the one or more capacitors may be initiated when a voltage of the one or more capacitors is less than the lower first voltage threshold. Charging of the one or more capacitors may then be continued until the voltage of the one or more capacitors is equal to or greater than the upper second voltage threshold. In some embodiments, the upper second voltage threshold may be less than a maximum rated voltage of the one or more capacitors in order to provide a desired output voltage to the associated electronics of the door lock system. In such an embodiment, the one or more super capacitors may also be viewed as cycling between upper and lower state of charge thresholds that are both less than 100% state of charge of the one or more capacitors.

It should be understood that the different voltage thresholds noted above may correspond to any desired combination of voltages depending on the particular application as well as the type, size, and arrangement of the one or more capacitors. However, in one embodiment, a lower first voltage threshold may be between or equal to 4.8 V and 5.6 V, 5.0 V and 5.4 V, 5.1 V and 5.3 V, or any other appropriate voltage. Correspondingly, the upper second voltage threshold may be between or equal to 6 V and 5.2 V, 5.7 V and 5.3 V, and 5.4 V and 5.6 V or any other appropriate voltage. For example, in one embodiment, the lower first voltage threshold may be 5.2 V and the upper second voltage threshold may be 5.5 V. In such an embodiment, the one or more capacitors would be cyclically charged and discharged between 5.2 V and 5.5 V during operation.

As noted previously, in some embodiments, one or more power sources used to provide power to the one or more capacitors may have a lower maximum power rating then the associated one or more capacitors the one or more power sources provide power to. In such an embodiment, the one or more capacitors may be charged at a rate that is less than a rate they are discharged at during a discharge pulse to provide power to one or more associated electrical loads. Accordingly, the charging time to go from a lower voltage threshold to an upper voltage threshold of the one or more capacitors may be greater than the above-noted pulse durations. However, it should be understood that embodiments in which the or more capacitors are charged at rates equal to or greater than the associated discharge rates when powering one or more electrical loads are also contemplated as the disclosure is not so limited.

The one or more capacitors described in various embodiments herein may be charged in any number of ways. For example, in one embodiment, a constant current and voltage may be applied to the one or more capacitors during charging. Alternatively, in another embodiment, a pulsed current may be applied to charge the one or more capacitors. In one such embodiment, pulses with currents between about 50 mA and 150 mA, 75 mA and 125 mA, or any other appropriate current may be applied using a plurality of pulses with durations between or equal to 100 ms and 500 ms, 200 ms and 500 ms, 300 ms in 500 ms, or any other appropriate pulse duration. The charging pulses may be applied for a sufficient duration to fully charge the one or more capacitors to a desired voltage and/or state of charge.

While specific charging strategies as well as specific pulse magnitudes and durations are described above, it should be understood that the one or more capacitors described herein may be charged in any appropriate manner as the disclosure is not so limited.

For the sake of clarity, the various methods and electrical systems detailed herein and illustrated in the figures are described relative to a door lock. However, it should be understood that the various methods and electrical systems described herein are not limited to only being used with door locks. Instead, the currently described methods and electrical systems may be used to provide power to electrical loads associated with any appropriate system where it may be desirable to provide an efficient power transfer, low power leakage, and/or improved power rating capabilities as the disclosure is not so limited.

Turning now to the figures, several non-limiting embodiments are described in further detail. It should be understood that the various components, features, and methods described in relation to the figures may be used either individually and/or in any appropriate combination as the current disclosure is not limited to only those specific embodiments described herein.

FIG. 1 depicts one embodiment of a door lock 2. The door lock includes a housing 4 with a first power source 8, a second power source 10, and one or more capacitors 12 disposed therein. The first and second power sources as well as the one or more capacitors are in electrical communication with, and are controlled by, a controller 6. As described further below, the controller may correspond to any appropriate combination of microprocessors and/or electrical circuitry that permits the controller to appropriately control the flow of power to and from the various power sources and one or more capacitors associated with the door lock. The door lock may also include one or more systems for accepting identification of a person such as a wireless communication device 14 or a keypad 20. Appropriate types of wireless communication devices include, but are not limited to, a Wi-Fi transmitter, a Bluetooth device, a radiofrequency identification reader, or any other appropriate device capable of reading and/or transmitting information. The door lock may also include an electrical load such as a lock motor 16 that is controlled by the controller to selectively move a bolt 18 between a locked and unlocked state. Other types of electrical loads that may be controlled by the controller 6 include, but are not limited to, LEDs, displays, magnetic strip readers, or any other appropriate electrical load that may be used with a door lock.

The various power sources depicted in FIG. 1 may correspond to any appropriate type of power source including but not limited to, hardwired power, primary electrochemical cells, secondary electrochemical cells, sources of harvested energy (e.g. photovoltaic cells, motion harvesters, thermoelectric generators, and/or any other appropriate device capable of harvesting energy), and/or any other appropriate type of power source as the disclosure is not so limited. Combinations of the above types of power sources are also contemplated. For example, a door lock may include hardwired power and/or one or more primary electrochemical cells in combination with one or more secondary electrochemical cells that are charged with power captured by an associated source of harvested energy. The various power sources may also be arranged to provide redundant power using any appropriate arrangement including two power sources that are diode or'd together to function as redundant power sources. Specific arrangements are detailed further below.

As previously discussed, some electrical loads of a door lock may have higher power requirements than others. For example, in one embodiment, the lock motor 16 and the wireless communication device 20 of FIG. 1, which may include a radiofrequency identification reader, may have higher power requirements than the other associated electrical loads 24. Accordingly, as detailed further below, in some embodiments, the one or more capacitors 12 may supply power to these higher power requirement loads while the first power source 8 and/or second power source 10 may provide power to the other electrical loads at a lower power without being buffered through the one or more capacitors first. While specific electrical loads have been noted above, it should be understood that embodiments in which the one or more capacitors may be used to provide power to any electrical load of the door lock as well as to electrical loads with different power requirements are also contemplated as the disclosure is not so limited.

Figure 2:
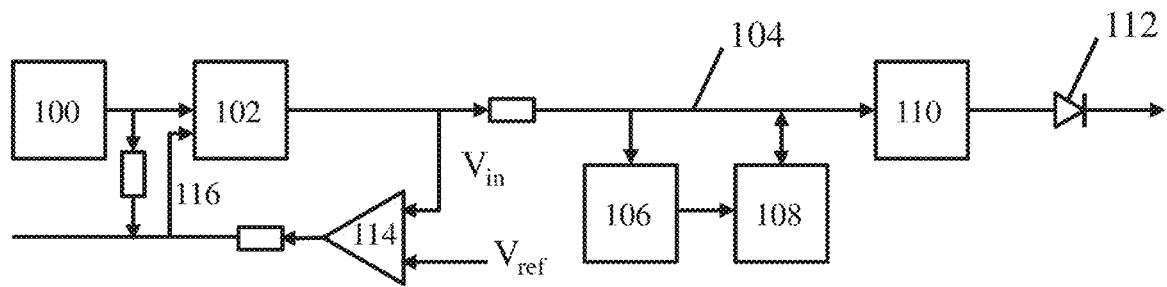
FIG. 2 is a schematic representation of one embodiment of an electrical power system for a door lock.

FIG. 2 depicts one embodiment of a power system for a door lock. In the depicted embodiment, a power source 100 is in electrical communication with a voltage regulator 102. The voltage regulator changes the voltage of the power provided from the power source from a first voltage to a second different voltage which may be greater than or less than the first voltage depending on the desired application. The voltage regulator is in electrical communication with a voltage rail 104. The voltage rail is in electrical communication with one or more capacitors 108.

In instances where a plurality of capacitors are used, the power system may also include a balancing circuit 106 that is in electrical communication with the one or more capacitors. As noted previously, any appropriate type of balancing circuit may be used. In some embodiments, a blocking FET 110 and/or a diode 112 may be positioned along the voltage rail to prevent the backflow of current and/or to help regulate the voltage supplied by the one or more capacitors to one or more associated electrical loads, not depicted.

To control the supply of power from the power source 100 to the one or more capacitors 108, in some embodiments, the power system depicted in FIG. 2 may include a voltage comparator 114 that compares a voltage output $V_{in}$ from the voltage regulator to a reference voltage $V_{ref}$ to provide a control signal 116 that is output to the voltage regulator to control operation of the voltage regulator. In some embodiments, the reference voltage may correspond to a measured voltage of the one or more capacitors using any appropriate type of voltage sensing arrangement. However, while a particular type of control circuit for the voltage regulator has been directed, it should be understood that any other appropriate arrangement capable of controlling the power and/or voltage applied to the one or more capacitors may also be used as the disclosure is not so limited.

Figure 3:
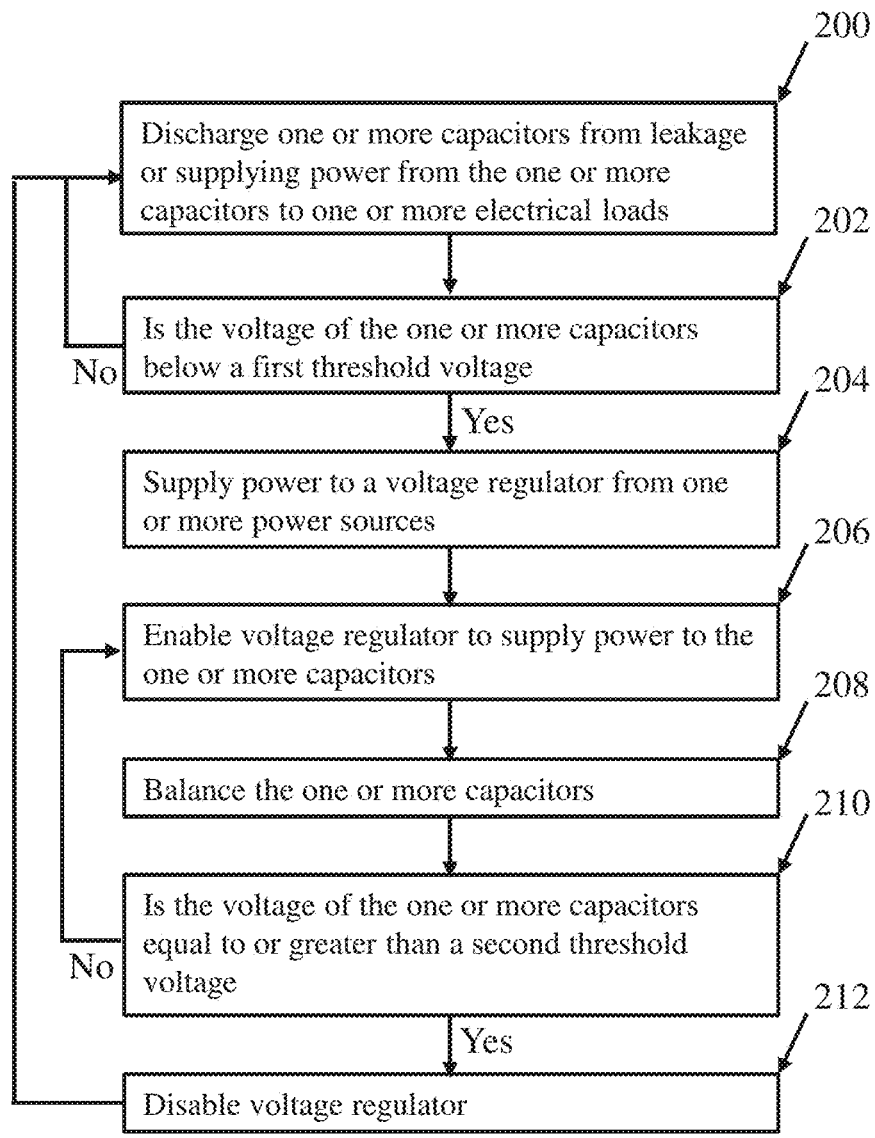
FIG. 3 is a flow diagram of one embodiment of a method for operating the electrical power system of FIG. 2.

Turning now to FIG. 3, a method of operating the power system of FIG. 2 is described. At 200 the one or more capacitors 108 are discharged either from leakage or from supplying power to one or more electrical loads connected to the voltage rail 104. At 202 the voltage of the one or more capacitors is compared to a first voltage threshold. If the voltage of the one more capacitors is above, i.e. not below, the first voltage threshold the capacitors are permitted to continue discharging. However, if the voltage of one or more capacitors is below the first voltage threshold, which may be indicated by the control signal 116 provided to the voltage regular 102, charging of the one or more capacitors may begin. Specifically, at 204 and 206, power is supplied from the power source 100 to the voltage regulator and the voltage regulator is enabled to supply power to the one or more capacitors.

In instances where multiple capacitors are used, the balancing circuit 106 may either actively and/or passively balance the voltage of the one or more capacitors at 208. This may be accomplished either during or after charging as the disclosure is not so limited. In either case, at 210, a voltage of the one or more capacitors is compared to a second larger voltage threshold. If the voltage of the one more capacitors is less than the second voltage threshold, charging of the one or more capacitors is continued. If the voltage of the one or more capacitors is greater than or equal to the second voltage threshold, the control signal 116 provided from the voltage comparator 114 to the voltage regulator may disable the voltage regulator at 212. Disabling the voltage regulator stops the flow of power from the power source to the associated one or more capacitors.

The above method of may be implemented during continuous operation of a door lock system. Accordingly, the depicted power system will periodically charge the one or more capacitors between the first and second voltage thresholds when the one or more capacitors have been discharged either due to power leakage or from powering one or more electrical loads of the door lock. Further, it should be understood that in this embodiment, as well as the other embodiments described herein, the one or more capacitors may be charged even while they are supplying power to one or more electrical loads of the door lock.

Figure 4:
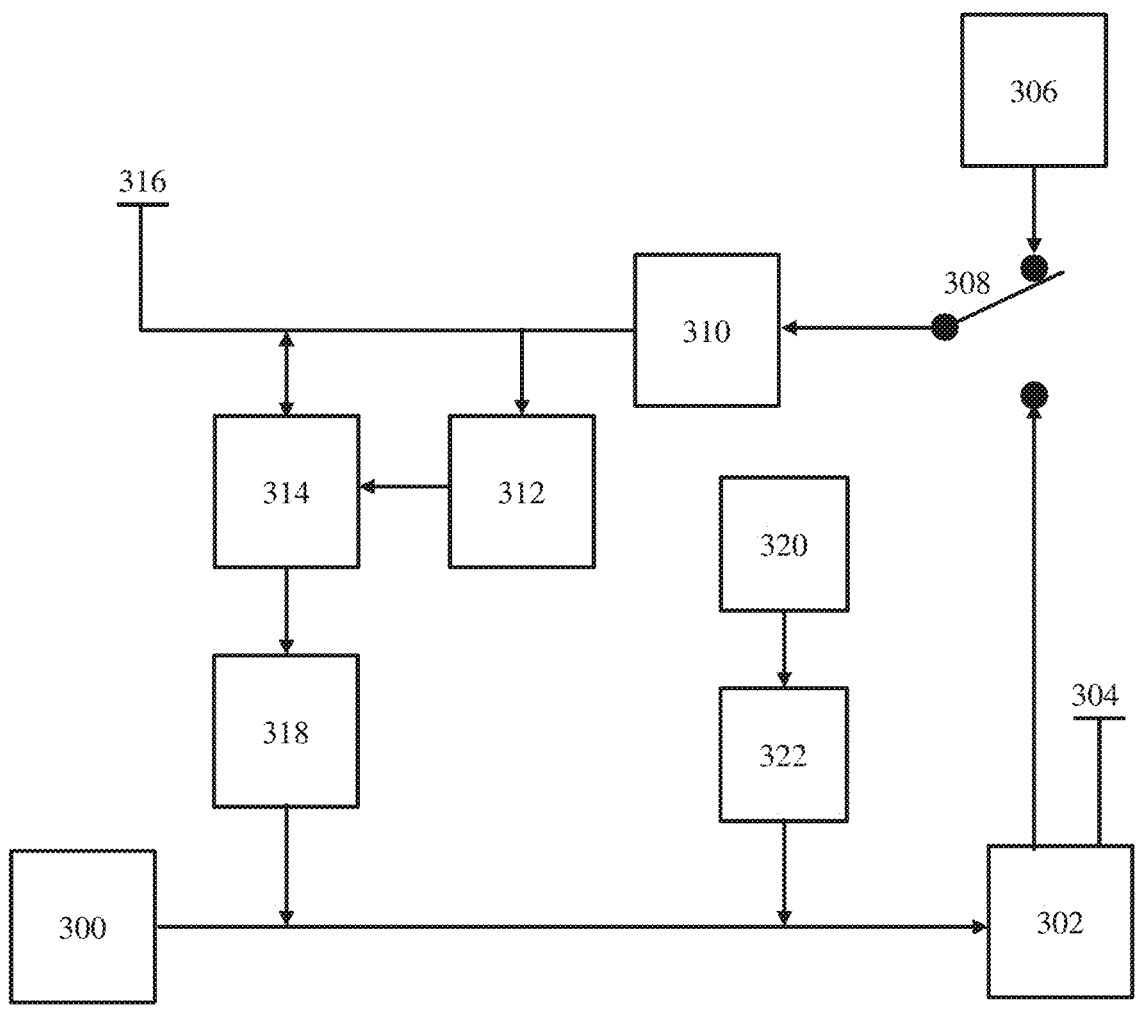
FIG. 4 is a schematic representation of one embodiment of an electrical power system for a door lock.

Turning now to FIG. 4, an embodiment of an electrical system of a door lock including two power sources is described. In the depicted embodiment, a first power source 300 is in electrical communication with a first voltage regulator 302. While the first power source may correspond to any appropriate type of power source, in one embodiment, the first power source may correspond to hardwired power, a primary electrochemical cell, and/or a combination of these types of power sources diode or'd together to provide power to the first voltage regulator. The first voltage regulator is in electrical communication with a first voltage rail 304 that may provide power to a first set of one or more electrical loads, not depicted. The first voltage regulator and a separate second power source 306 are in electrical communication with a switch 308. The second power source may correspond to any appropriate power source, but in at least one embodiment, the second power source is a secondary electrochemical cell, a device capable of harvesting energy, and/or a combination of a secondary electrochemical cell and a device capable of harvesting energy that is used to recharge the secondary electrochemical cell. The switch may provide selective electrical communication with a second voltage regulator 310 from either the second power source or the first voltage regulator based on one or more operating parameters of the second voltage source and/or the first voltage regulator as detailed further below. The second voltage regulator is in electrical communication with one or more capacitors 314 that may include an associated balancing circuit 312 if a plurality of capacitors are used. The one or more capacitors and the voltage regulator may both be in electrical communication with a second voltage rail 316 that supplies power to a second set of one or more connected electrical loads, not depicted.

In some embodiments, the one or more electrical loads connected to the second voltage rail 316 may have higher power requirements than the one or more electrical loads connected to the first voltage rail 304. Accordingly, the second voltage rail and the associated one or more capacitors may have a larger power rating, i.e. may be capable of providing a larger maximum power, then the first power source 300 and first voltage rail. Additionally, in some embodiments, the second voltage rail and the one or more capacitors may also have a power rating that is greater than a power rating of the second power source as well. However, it should be understood that embodiments in which the first power source, second power source, and/or first voltage rail provide larger maximum powers and/or the same maximum power as the second voltage rail are also contemplated as the disclosure is not so limited.

In some embodiments, it may be desirable to power a door lock with power stored in the one or more capacitors 314 during a power failure of the first power source 300 and/or second power source 306. Accordingly, as shown in the figure, in some embodiments the one or more capacitors may be in electrical communication with the first voltage regulator as well. In order to prevent reverse flow of current, it may be desirable to include a diode 318 between the one or more capacitors and the first voltage regulator. While any appropriate connection may be used, in some instances, diode 318 may be diode or'd with the first power source at the same nominal voltage as the first power source. Thus, the one or more capacitors may supply power to the electrical loads connected to the first voltage rail 304 as well as the electrical loads connected to the second voltage rail 316 as well during a power failure.

In order to power a door lock after a complete loss of power after the one or more capacitors have been drained, in some embodiments, the electrical system of a door lock may include an external power connection 320. Appropriate types of power connections include USB power connections, battery connections, electrical terminals, or any other component capable of connecting to and accepting power from an external power source. Similar to the above, a diode 322 may be positioned between the external power source connection and the first voltage regulator 302 to provide a diode or'd configuration with the first power source and the external power connection to supply power to the first voltage regulator at the same nominal voltage as the first power source.

Figure 5:
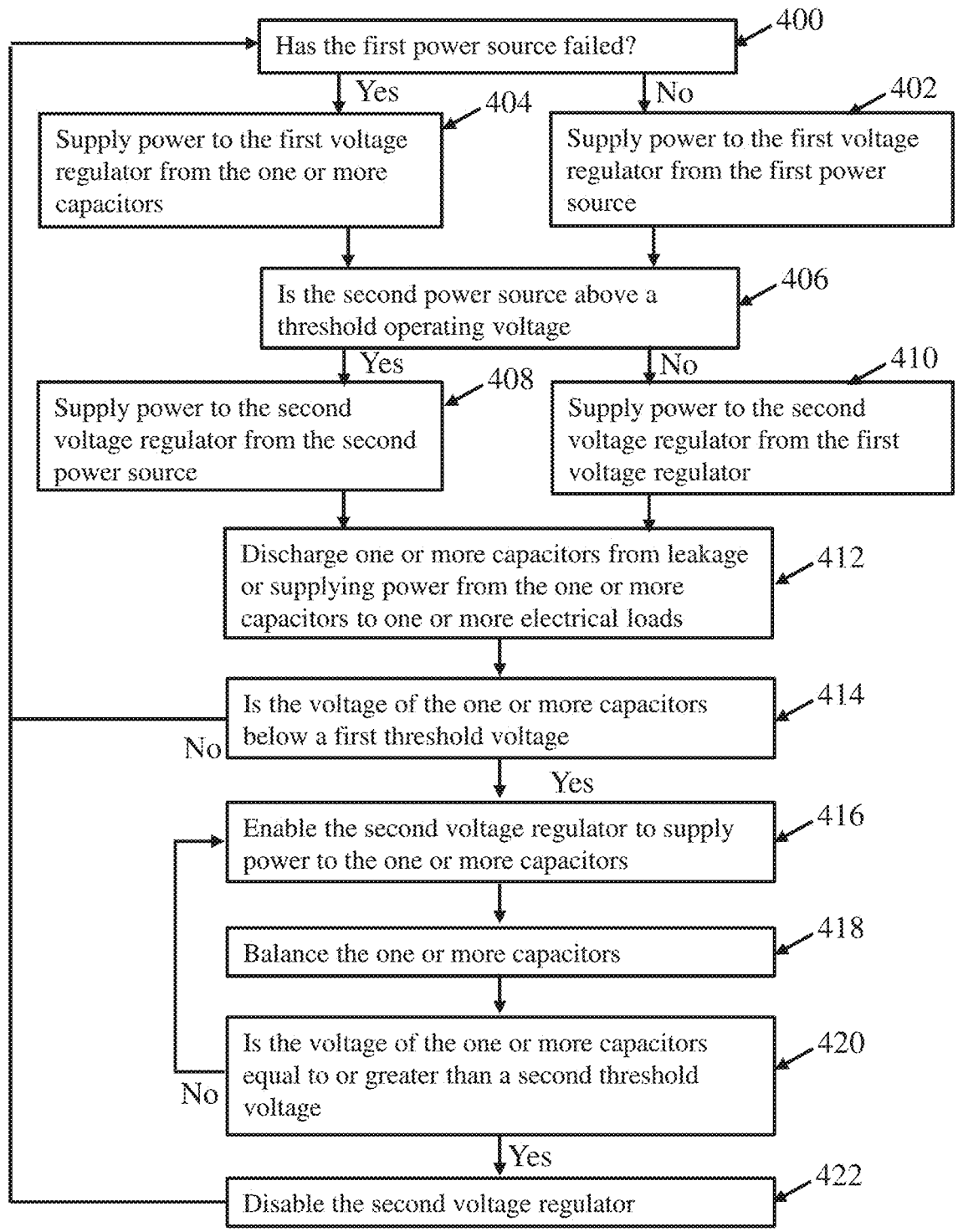
FIG. 5 is a flow diagram of one embodiment of a method for operating the electrical power system of FIG. 4.

FIG. 5 depicts one embodiment of a method for operating the electrical system depicted in FIG. 4. At 400, it is determined if the first power source 100 has failed. A power failure of the first power source may be determined in any number of ways including, for example, determining that a voltage output from the first power source is less than a low voltage threshold. If the first power source has not failed, the first power source supplies power to the first voltage regulator 302 at 402. However, if the first power source has failed, the one or more capacitors 314 may supply power to the first voltage regulator at 404 which supplies power to one or more associated electrical loads. Thus, the one or more capacitors may be used to power the electronics of a door lock in the event of a power failure. The door lock may be returned to normal operation after a voltage of the first power source rises above the low voltage threshold, or in some embodiments, above a reset voltage threshold which may be greater than the low voltage threshold.

At 406 an associated controller, not depicted, may determine if the second power source 306 is operating above or below a threshold operating voltage and/or state of charge. Again, in some embodiments the second power source may be a secondary electrochemical cell capable of being recharged by one or more types of harvested energy. If the second power source 306 has a voltage and/or state of charge that is greater than the threshold operating voltage and/or state of charge, the switch 308 may be operated to disconnect the first voltage regulator and provide selective electrical communication between the second voltage regulator and the second voltage regulator 310 to supply power from the second power source to the second voltage regulator, see 408. Alternatively, at 410, when the voltage and/or state of charge of the second power source is less than the threshold operating voltage and/or state of charge the switch disconnects the second power source and places the second voltage regulator in electrical communication with the first voltage regulator to supply power from the first voltage regulator to the second voltage regulator. In some embodiments, the voltage provided to the second voltage regulator from the second power source and/or the first voltage regulator may be a first voltage and the voltage output by the second voltage regulator may be a second voltage different from the first voltage. Depending on the particular application, the second voltage may be greater than or less than the first voltage.

It should be understood that switch 308 may change state multiple times during operation of a door lock as the voltage of the second power source rises above, and subsequently falls below, the threshold operating voltage and/or state of charge. Therefore, while the flow diagram only depicts a single decision point, it should be understood that in some embodiments the switch may be controlled continuously to selectively provide power from the second power source or first voltage regulator to the second voltage regulator.

Regardless of where the second voltage regulator 310 is receiving power from, the second voltage regulator 310 and one or more capacitors 314 may be operated in a manner similar to that described above in relation to FIGS. 2 and 3. Specifically, as shown in FIG. 5, at 412 the one or more capacitors are discharged from either power leakage and/or supplying power to one or more electrical loads connected to the second voltage rail 316. It is determined whether or not the voltage of the one or more capacitors is below a first voltage threshold at 414. If the voltage of the one or more capacitors is greater than the first voltage threshold, the door lock control system may continue to monitoring the various power sources and one or more capacitors without charging the one or more capacitors as shown by the arrow directed back to 400. However, if the voltage of the one or more capacitors is less than the first voltage threshold, the second voltage regulator may be enabled to supply power to the one or more capacitors and the second voltage rail at 416. As described previously, if a plurality of capacitors are used, the balancing circuit 312 may be used to balance the state of charge and/or voltage of the capacitors at 418. The second voltage regulator may continue to supply power to the one or more capacitors until a voltage of the one or more capacitors is equal to or greater than a second voltage threshold that is greater than the first voltage threshold, see 420. The second voltage regulator may then be disabled to discontinue the supply of power from the second voltage regulator to the second voltage rail and one or more capacitors at 422. The method then returns to 400 to determine the operating states of the various power sources and one or more capacitors until the next charging cycle.

As noted above, in some embodiments, the one or more capacitors 314 may be used to power a door lock during a power failure of the first power source 300, which in some cases may be a primary power source, and/or a power failure of the second power source 306. During such a power failure it may be desirable for a door lock to be placed into a desired failure state. For example, it may be desired for a door lock to either fail in the open or locked configuration when a power failure occurs depending on the particular application. Thus, in some embodiments, if the voltage of a primary power source, such as the first power source depicted in FIG. 4, falls below a low voltage threshold indicating a power failure, a controller of the door lock may command the electrical door lock to a desired failure locking state. Specifically, a controller of the door lock may use power from the one or more capacitors to operate a lock motor to move a bolt into a desired locked or unlocked position during a power failure of at least one, and in some instances all, of the power sources associated with a particular door lock.

Typical methods for performing charge counting are relatively charge intensive for long duration applications since they use continuous charge monitoring. Therefore, as discussed previously, it may be desirable to provide a low power consumption method for monitoring the amount of harvested and/or used energy for a door lock. As outlined below, the Inventors have recognized that it is possible to use a timing circuit to measure a time it takes to recharge the one or more capacitors to estimate an amount of energy input into the one or more capacitors. The amount of energy to the one capacitors may be used to monitor the consumption and/or generation of energy within the system. It should be understood that such an energy estimation method may be used with a door lock including electrical power and control systems similar to those described above in relation to FIGS. 1-5.

Figure 6:
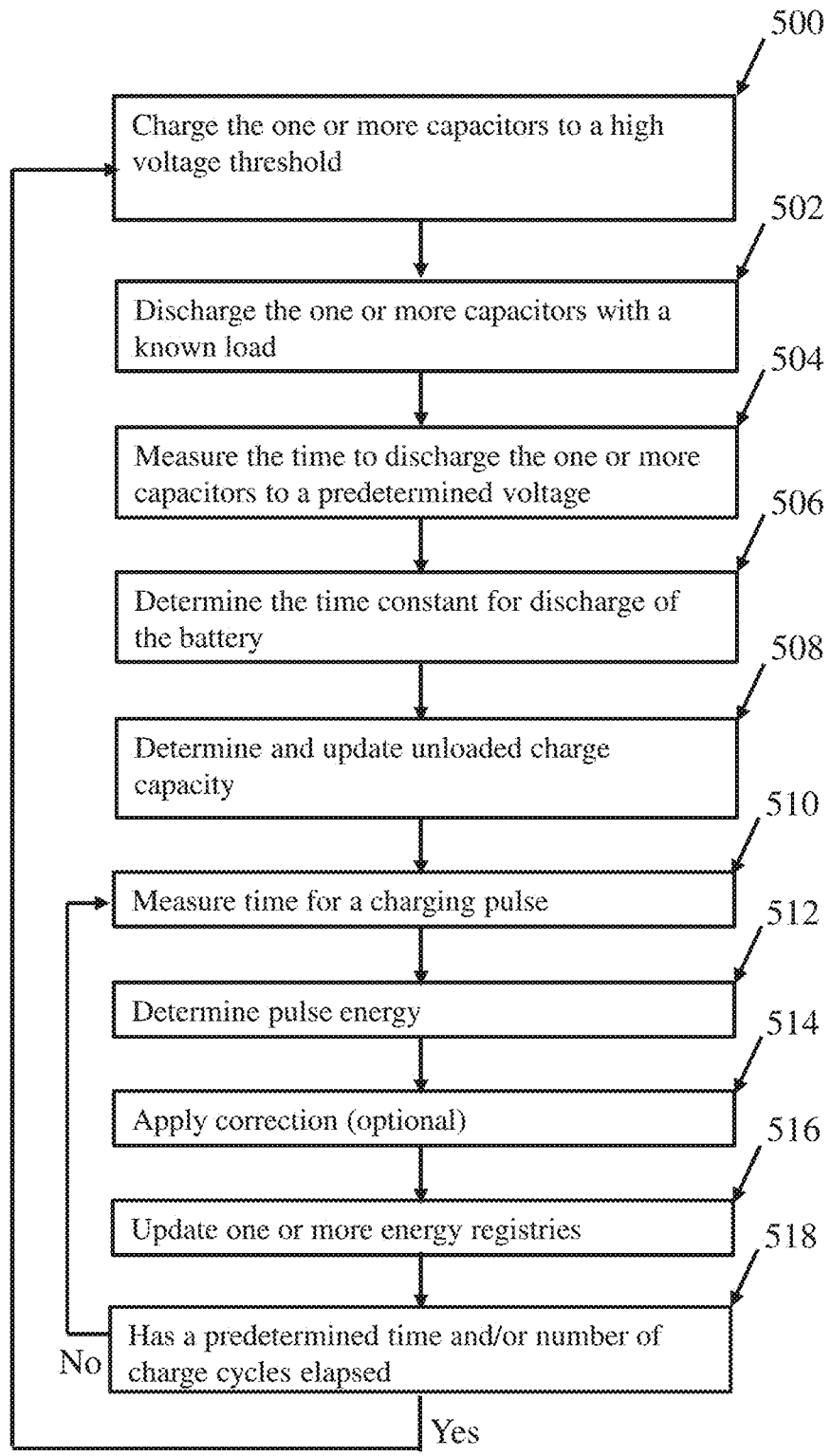
FIG. 6 is a flow diagram of one embodiment of a method for estimating the amount of energy provided to one or more capacitors from one or more power sources.
Figure 7:
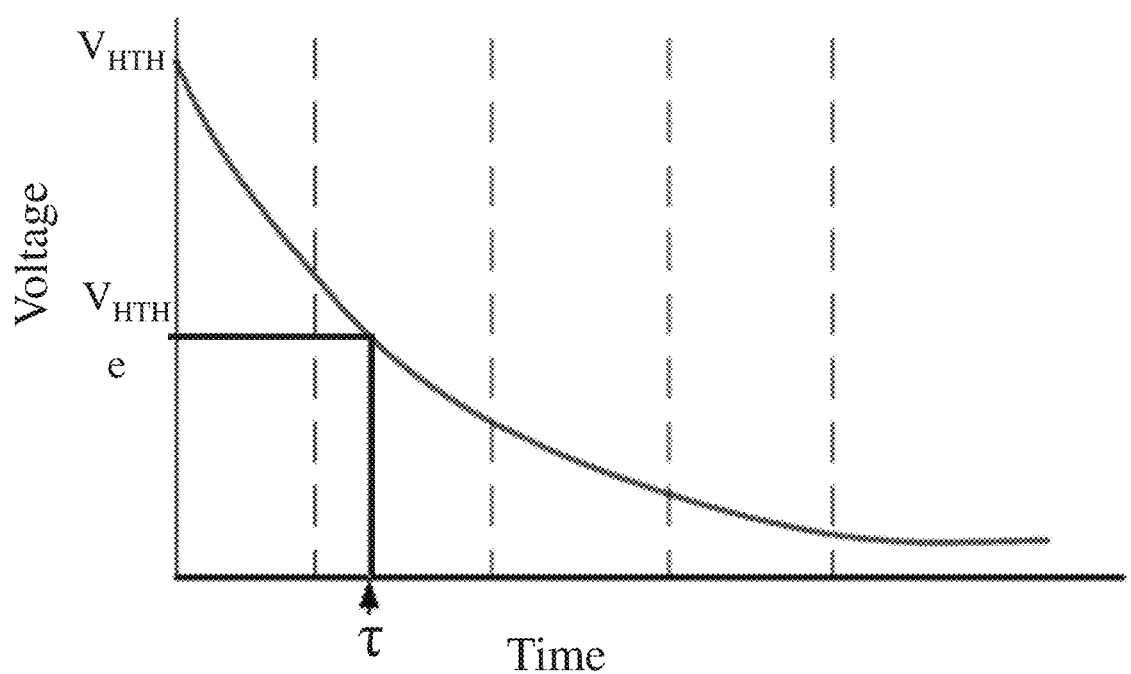
FIG. 7 is a schematic graph of voltage versus time.

FIG. 6 shows a schematic flow diagram of one embodiment of a method for monitoring energy usage and/or generation within a system where one or more capacitors are used to buffer energy provided one or more electrical loads. At 500, one or more capacitors are charged to a high voltage threshold $V_{HTH}$. The capacitors are then discharged under a known load at 502. The period of time for discharging the more capacitors to a predetermined voltage is then measured at 504. For example, in some embodiments, and as shown in FIG. 7, the voltage of the one or more capacitors may be discharged from $V_{HTH}$ to a voltage of $V_{HTH}/e$. The time to discharge the one or more capacitors to the lower voltage may thus correspond to the time constant T. However, embodiments in which the one or more capacitors are discharged to a different voltage and the time constant is calculated are also contemplated as the disclosure is not so limited. In order to avoid self-discharge of the one or more capacitors prior to the measurement, in some embodiments, the above-noted measurement may be conducted immediately after charging the one or more capacitors.

At 508, the time constant τ for the one or more capacitors may be used to determine a capacitance of the one or more capacitors when they are charged between a lower voltage threshold $V_{LTH}$ and the above-noted higher voltage threshold $V_{HTH}$. In some embodiments, these voltage thresholds may correspond to upper and lower voltage thresholds of the one or more capacitors during operation of the door as discussed above. A capacitance of the one or more capacitors may be determined using:

$$C = \tau/R$$

In the above equation, C is the capacitance of the one or more capacitors and R is the resistance of the load used to discharge the one or more capacitors. The energy used to charge the one or more capacitors when they are not actively being used to power an electrical load may then correspond to:

$$J_O = \frac{C}{2}(V_{LTH}^2 - V_{HTH}^2)$$

In the above equation $J_o$ is equal to the energy used to charge the unloaded one or more capacitors and the other variables are as described above. After calculating the energy used to charge the one or more capacitors from the lower voltage threshold to the upper voltage threshold, a corresponding registry for an unloaded charge capacity of the one or more capacitors may be updated in a memory associated with a controller of the one or more capacitors. As detailed below, this unloaded charge capacity may be used for determining the amount of energy used when charging the one or more capacitors during operation.

Due to the one or more capacitors being charged at a relatively low charge rate, in some embodiments, the charge capacity of the one or more capacitors is relatively insensitive to changes in temperature. Accordingly, the determined unloaded charge capacity may not be corrected for temperature in some applications. However, embodiments in which the one or more capacitors are charged at a rate fast enough that temperature may influence the charge capacity of the one or more capacitors are also contemplated. In such an embodiment, it may be desirable to correct the determined charge capacity of the one or more capacitors during both this calibration process and/or during operation using a temperature signal of the one or more capacitors provided by the one or more temperature sensors and any appropriate function, graph, table or other method used to provide an appropriate temperature correction.

In some instances, the one or more capacitors may be charged while they are providing power to one or more electrical loads. Therefore, it may be desirable to account for the energy provided to the one or more electrical loads during charging of the one or more capacitors in addition to the energy used to charge the one or more capacitors. Thus, in some embodiments, an amount of energy supplied to the one capacitors during a charging pulse may be determined by measuring the amount of time it takes to charge the capacitors, see 510 and 512. For example, in one embodiment, the energy may be determined using:

$$J_P = J_o(t_C/t_o)$$

In the above equation: $J_P$ is the energy provided to the one or more capacitors during a charging pulse; $J_o$ is the charge capacity of the one or more capacitors when no load is applied to the one or more capacitors (i.e. the unloaded state); $t_c$ is the measured pulse duration, or charging time, of the one more capacitors; and $t_o$ is the pulse duration, or charging time, of the one or more capacitors in the unloaded state. Thus, the above relationship may be used to determine the energy provided to the one or more capacitors even when power is being provided from the one or more capacitors to one or more associated loads during a charging pulse.

In the above embodiments, it should be understood that measuring the time duration of a charging and/or discharging pulse may be accomplished in any number of ways. For example, in one embodiment, a charging and/or discharging pulse duration may be measured by measuring the time between a measured rising edge and falling edge of a voltage of the one or more capacitors during a charging pulse. Though, other ways of measuring a charging and/or discharging pulse may also be used as the disclosure is not so.

Depending on the particular embodiment, it may be desirable to apply a correction to the determined charging pulse energy $J_P$ to provide a more accurate measure of energy provided to the one or more capacitors at 514. While any appropriate form of correction may be used, in one embodiment, an exponential fit between a calculated and experimentally determined energy provided to the one or more capacitors may be used. For example a correction factor may be applied to the calculated energy for different charging times as detailed in the equation below.

$$J_C = J_P B^{\alpha t_C}$$

In the above equation: $J_C$ is the corrected energy provided to the one or more capacitors during a charging pulse; B is a correction factor that is determined experimentally; a is a correction factor that is determined experimentally; and $J_P$ and $t_C$ are the calculated charging pulse energy and measured charging pulse duration as described above. It should be understood that the correction factors may be determined experimentally in any appropriate manner. However, in one embodiment, the correction factors may be determined by measuring the amount of energy provided to the one or more capacitors during a charging pulse and comparing the measured amount to the calculated charging pulse energy for different charging pulse durations $t_C$. The correction factors may then be calculated using any appropriate fitting technique including, but not limited to, liner regression, non-linear regression, linear interpolation, non-linear or polynomial interpolation, and/or any other appropriate fitting technique as the current disclosure is not so limited. While a particular function has been illustrated above for correcting the supplied energy any appropriate function, graph, table or other method used to provide an appropriate correction may also be used as the disclosure is not so limited.

After determining the amount of energy provided to the one or more capacitors during a charging pulse, one or more energy registries contained within a memory of an associated controller may be updated with the amount of energy provided to the one or more capacitors, see 516. For example, in one embodiment, a prior value of an energy registry may correspond to the total amount of energy provided to the one or more capacitors from all of the previous charging pulses. This value may then be incremented by the amount of the current charging pulse to provide an updated total energy provided to the one or more capacitors. Alternatively, in embodiments including multiple power sources, it may be desirable to track the amount of energy provided from each power source to the one or more capacitors separately. This may provide information such as the amount of energy consumed from a primary electrochemical cell and/or the amount of energy harvested from one or more energy sources associated with a rechargeable secondary electrochemical cell. For example, when energy is provided to the one or more capacitors from a first power source, an energy registry corresponding to the amount of energy provided to the one from the first power source may be updated with the amount of energy provided in the current charging pulse. Correspondingly, when energy is provided to the one or more capacitors from a second power source, an energy registry corresponding to the amount of energy provided to the one or more capacitors from the second power source may be updated with the amount of energy provided in the current charging pulse.

The charge capacity of capacitors is known to change over time and with increasing numbers of charge and discharge cycles. Accordingly, it may be desirable to periodically update the measured charge capacity of the one or more capacitors of a door lock to help maintain an accurate estimation of the amount of energy provided to the one or more capacitors during a charging pulse. For example, as shown in FIG. 6 at 518, after a predetermined time and/or number of charge cycles has elapsed, the charge capacity of the one or more capacitors may be recalibrated as indicated by the arrow directed to the start of the flow diagram at 500. After recalibrating the charge capacity of the one or more capacitors, the amount of energy provided to the one or more capacitors may continue to be estimated as described previously relative to step 510-518 until the next calibration period.

Due to the consumption of energy during the calibration of a charge capacity of the one or more capacitors, it may be desirable to limit how often the charge capacity is calibrated for a system to avoid unnecessary waste of energy. For example, in one embodiment, a charge capacity of the one or more capacitors may be checked at least every five days, 10 days, 15 days, and/or at any other appropriate time period. Additionally, a charge capacity of the one or more capacitors may be checked after every 50 charging cycles, 100 charging cycles, 200 charging cycles, and/or any other appropriate number of charging cycles. While specific times and number cycles are given above for calibrating a charge capacity of the one more capacitors, it should be understood that times and cycle numbers both greater than and less than those noted above are also contemplated as the disclosure is not so limited.

The above-described embodiments of the technology described herein may be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the disclosed embodiments may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a non-transitory computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present disclosure as discussed above. Additionally, it should be appreciated that according to one aspect of this embodiment, one or more computer programs that when executed perform methods of the present disclosure need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An electrical door lock comprising:
   at least one power source;
   at least one voltage regulator in electrical communication with the at least one power source;
   one or more capacitors in electrical communication with the at least one voltage regulator; and
   one or more electrical loads of the electrical door lock in electrical communication with the one or more capacitors, wherein when a voltage of the one or more capacitors is less than a first voltage threshold the at least one voltage regulator supplies power from the at least one power source to the one or more capacitors, and wherein when the voltage of the one or more capacitors is greater than a second voltage threshold that is greater than the first voltage threshold, the at least one voltage regulator stops the supply of power from the at least one power source to the one or more capacitors.

2. The electrical door lock of claim 1, wherein a maximum power rating of the one or more capacitors is greater than a maximum power rating of the at least one power source.

3. The electrical door lock of claim 1, wherein the at least one power source includes a first power source and a second power source, wherein the at least one voltage regulator includes a first voltage regulator and a second voltage regulator, wherein the first power source is in electrical communication with the first voltage regulator, and wherein at least one of the second power source and the first voltage regulator are in electrical communication with the second voltage regulator, wherein the second voltage regulator is in electrical communication with the one or more capacitors.

4. The electrical door lock of claim 3, further comprising a first electrical rail in electrical communication with the first voltage regulator and a second electrical rail in electrical communication with the one or more capacitors.

5. The electrical door lock of claim 3, wherein the second power source comprises one or more secondary electrochemical cells.

6. The electrical door lock of claim 3, further comprising a switch that selectively places the second voltage regulator in electrical communication with one of the second power source and the first voltage regulator.

7. The electrical door lock of claim 6, wherein the switch places the second power source in electrical communication with the second voltage regulator when a voltage of the second power source is greater than a third voltage threshold.

8. The electrical door lock of claim 7, wherein the switch places the second voltage regulator in electrical communication with the first voltage regulator when the voltage of the second power source is less than the third voltage threshold.

9. The electrical door lock of claim 7, wherein the switch disconnects the second voltage regulator from the first power source when the voltage of the second power source is greater than the third voltage threshold.

10. The electrical door lock of claim 3, wherein in at least one mode of operation the one or more capacitors are in electrical communication with the first voltage regulator such that the one or more capacitors provide power to the first voltage regulator.

11. The electrical door lock of claim 1, wherein the one or more capacitors power the electrical door lock during a power failure of the at least one power source, and a controller of the electrical door lock commands the electrical door lock to a desired failure locking state.

12. The electrical door lock of claim 1, wherein the one or more capacitors are one or more super capacitors.

* * * * *